US011557908B2

(12) United States Patent
Masuda et al.

(10) Patent No.: US 11,557,908 B2
(45) Date of Patent: Jan. 17, 2023

(54) DEGRADATION-DETERMINATION SYSTEM AND METHOD FOR DETERMINING DEGRADATION OF SECONDARY BATTERY

(71) Applicant: MINEBEA MITSUMI Inc., Nagano (JP)

(72) Inventors: Shigemi Masuda, Shizuoka (JP); Naoki Tsuji, Shizuoka (JP)

(73) Assignee: MINEBEA MITSUMI Inc., Nagano (JP)

( * ) Notice: Subject to any disclaimer, the term of this patent is extended or adjusted under 35 U.S.C. 154(b) by 249 days.

(21) Appl. No.: 17/261,943

(22) PCT Filed: Aug. 2, 2019

(86) PCT No.: PCT/JP2019/030522
§ 371 (c)(1),
(2) Date: Jan. 21, 2021

(87) PCT Pub. No.: WO2020/031899
PCT Pub. Date: Feb. 13, 2020

(65) Prior Publication Data
US 2021/0167607 A1 Jun. 3, 2021

(30) Foreign Application Priority Data
Aug. 6, 2018 (JP) .............................. JP2018-147713

(51) Int. Cl.
*H02J 7/00* (2006.01)
*H01M 10/44* (2006.01)
(Continued)

(52) U.S. Cl.
CPC ............. *H02J 7/005* (2020.01); *H01M 10/44* (2013.01); *H01M 10/48* (2013.01); *H02J 7/00719* (2020.01); *H01M 10/0525* (2013.01)

(58) Field of Classification Search
CPC ...... H02J 7/005; H02J 7/00719; H01M 10/44; H01M 10/48; H01M 10/0525
(Continued)

(56) References Cited

U.S. PATENT DOCUMENTS

| 2017/0153292 A1* | 6/2017 | Steiber ............... G01R 31/3648 |
| 2017/0324122 A1* | 11/2017 | Poirier .................. H01M 50/44 |
| 2018/0123189 A1* | 5/2018 | Biswas ............. G01N 29/2462 |

FOREIGN PATENT DOCUMENTS

| JP | 2011-078180 | 4/2011 |
| JP | 2011-215125 | 10/2011 |

(Continued)

OTHER PUBLICATIONS

Extended European Search Report dated Dec. 6, 2021 with respect to the corresponding European patent application No. 19846588.2.
(Continued)

*Primary Examiner* — Nathaniel R Pelton
(74) *Attorney, Agent, or Firm* — IPUSA, PLLC

(57) ABSTRACT

A degradation-determination system includes a volume change detecting unit configured to detect a volume change of a lithium-ion battery, a capacity change detecting unit configured to detect a capacity change of the lithium-ion battery, and a charge control unit configured to control charge of the lithium-ion battery. The charge control unit is configured to determine that the lithium-ion battery is in a state of degradation, upon occurrence of a condition in which volume expansion of the lithium-ion battery is detected by the volume change detecting unit, in conjunction with a condition in which a decrease in a capacity of the lithium-ion battery is not detected by the capacity change detecting unit.

8 Claims, 4 Drawing Sheets

(51) Int. Cl.
*H01M 10/48* (2006.01)
*H01M 10/0525* (2010.01)

(58) Field of Classification Search
USPC .......................................................... 320/137
See application file for complete search history.

(56) References Cited

FOREIGN PATENT DOCUMENTS

| | | |
|---|---|---|
| JP | 2013-020826 | 1/2013 |
| JP | 2016-134259 | 7/2016 |
| JP | 2017-085735 | 5/2017 |

OTHER PUBLICATIONS

International Search Report for PCT/JP2019/030522 dated Sep. 17, 2019.

* cited by examiner

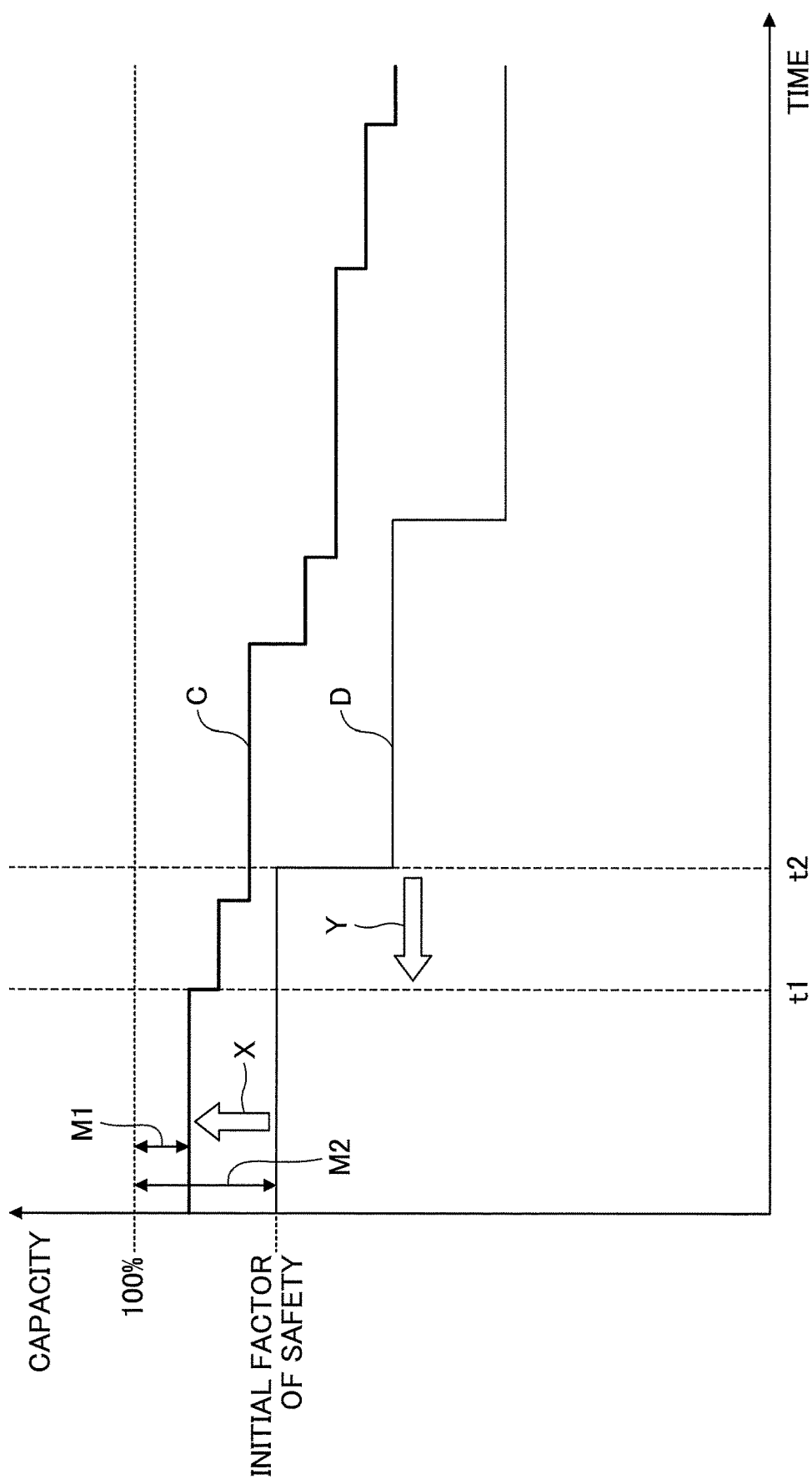

DEGRADATION-DETERMINATION SYSTEM AND METHOD FOR DETERMINING DEGRADATION OF SECONDARY BATTERY

TECHNICAL FIELD

The present disclosure relates to a degradation-determination system and a method for determining degradation of a secondary battery.

BACKGROUND

Secondary batteries such as lithium-ion batteries have higher energy density, and are compact and lightweight. For this reason, such secondary batteries are widely used in electricity storage systems such as electric vehicles or smartphones.

Repeated charging and discharging causes lithium-ion batteries to degrade. In the past, a state of degradation of such lithium-ion batteries has been estimated by measuring and monitoring the voltage, current, temperature, or the like associated with electrode terminals, and charge control has been performed in consideration of the extent of degradation (see, for example, Patent document 1).

CITATION LIST

Patent Document

[Patent document 1] Japanese Unexamined Patent Application Publication No. 2011-215125

SUMMARY

However, in the charge control in consideration of the extent of degradation, a large margin is set in a usage range of the secondary battery in order to be able to ensure sufficient safety with avoiding overcharge. In such a case, the difference between the capacity of the secondary battery capable of being charged in actuality and an upper limit (upper limit of a charge tolerance) of the charge capacity set in the charge control is increased, which results in a problem of a decreased charging efficiency. In order to improve the charge efficiency, it is desirable to improve accuracy in determining degradation of the secondary battery and to be able to reduce the margin for the charge capacity of the secondary battery.

An objective of the present disclosure is to provide a degradation-determination system and a method for determining degradation of a secondary battery in which a state of degradation of a battery can be estimated more precisely.

According to one aspect of one or more embodiments of the present disclosure, a degradation-determination system for a secondary battery includes a volume change detecting unit configured to detect a volume change of the secondary battery, a capacity change detecting unit configured to detect a capacity change of the secondary battery, and a charge control unit configured to control charge of the secondary battery. The charge control unit is configured to determine that the secondary battery is in a state of degradation, upon occurrence of a condition in which volume expansion of the secondary battery is detected by the volume change detecting unit, in conjunction with a condition in which a decrease in a capacity of the secondary battery is not detected by the capacity change detecting unit.

Likewise, according to one aspect of one or more embodiments of the present disclosure, a method for determining degradation of a secondary battery includes a volume-change detection step of detecting a volume change of the secondary battery, a capacity-change detection step of detecting a capacity change of the secondary battery, and a degradation-determination step of determining that the secondary battery is in a state of degradation, upon occurrence of a condition in which volume expansion of the secondary battery is detected in the volume-change detection step, in conjunction with a condition in which a decrease in a capacity of the secondary battery is not detected in the capacity-change detection step.

Effects of the Invention

According to the present disclosure, a degradation-determination system and a method for determining degradation of a secondary battery that are capable of improving accuracy for determining degradation, can be provided.

BRIEF DESCRIPTION OF DRAWINGS

FIG. 4 is a diagram illustrating an example of adjusting a factor of safety over usage time of the lithium-ion battery.

DESCRIPTION OF EMBODIMENTS

One or more embodiments will be hereafter described with reference to the accompanying drawings. In order to facilitate the understanding of explanation, in each figure, the same numerals denote the same components to the extent possible, and duplicative descriptions for the components will be omitted.

Figure 1:
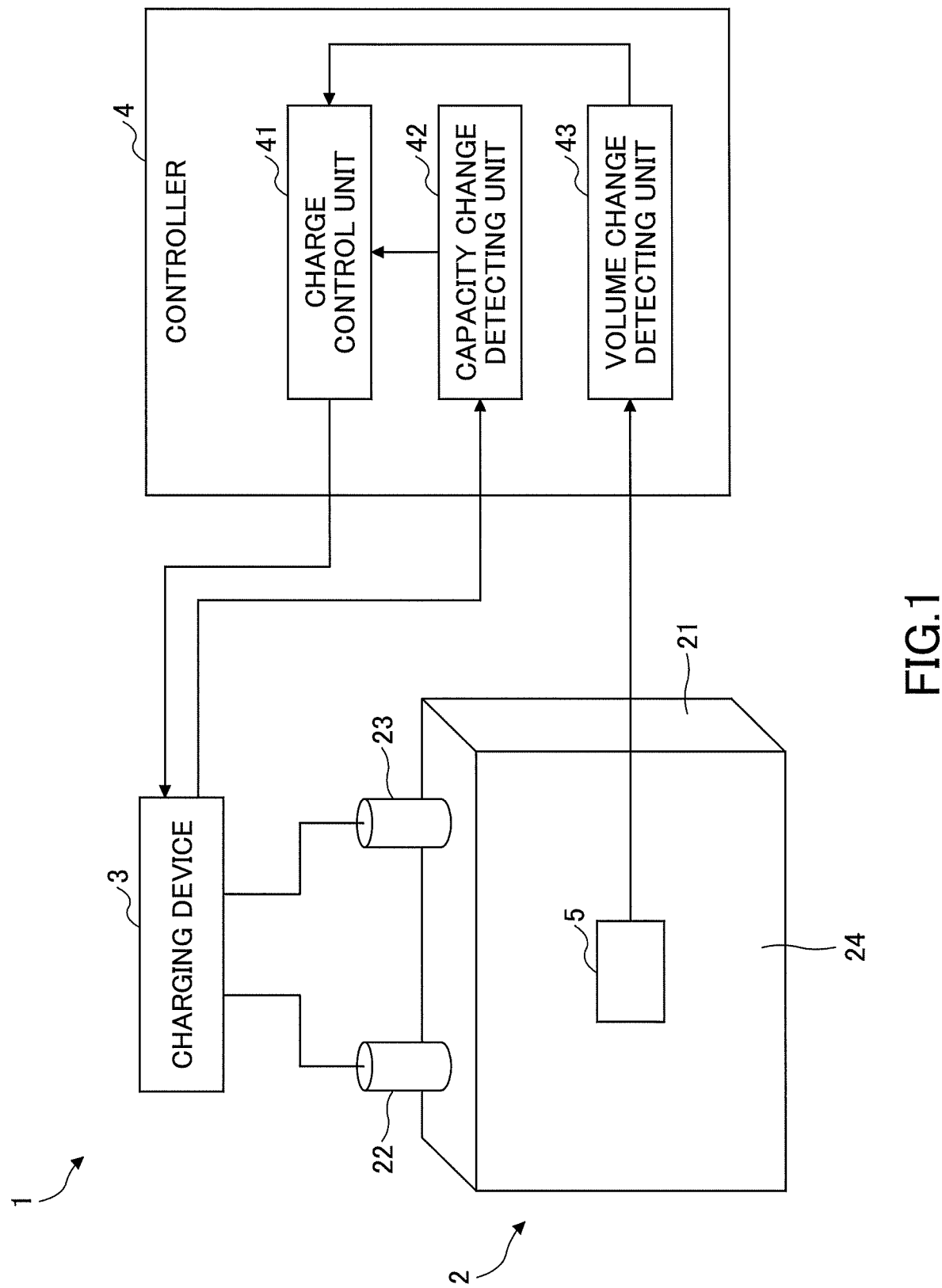
FIG. 1 is a block diagram schematically illustrating the configuration of a degradation-determination system according to an embodiment.

FIG. 1 is a block diagram schematically illustrating the configuration of a degradation-determination system 1 according to the embodiment. The degradation-determination system 1 determines degradation of a lithium-ion battery 2 as an example of a secondary battery. As illustrated in FIG. 1, the degradation-determination system 1 includes a charging device 3, a controller 4, and a strain gauge 5.

The lithium-ion battery 2 has the configuration illustrated in the example in FIG. 1, and is coated with a thin, substantially cuboidal housing 21 having a pair of principal surfaces 24. In FIG. 1, the pair of principal surfaces 24 of the housing 21 is disposed so as to face each other along a depth direction in the figure. Each principal surface is approximately rectangularly shaped, and a positive terminal 22 and a negative terminal 23 are provided on one (upper surface in FIG. 1) among four side surfaces of the housing 21 that are each perpendicular to the principal surface 24. One end of each of the positive terminal 22 and the negative terminal 23 protrudes outward from the housing 21, and is connected to the charging device 3. The lithium-ion battery 2 may be a single cell as illustrated in FIG. 1, or an assembled battery in which a plurality of single cells as illustrated in FIG. 1 are connected together.

The charging device 3 is connected to the positive terminal 22 and the negative terminal 23 of the lithium-ion battery 2, and charges the lithium-ion battery 2 via the positive terminal 22 and the negative terminal 23. For example, the charging device 3 stores a set value indicative of an upper limit of a charge tolerance that corresponds to the extent of degradation of the battery. The charging device 3 can charge the battery to the upper limit while referring the remaining battery capacity. The charging device 3 also outputs data, such as a time required to fully charge the battery, to the controller 4.

The controller 4 controls charging through the charging device 3. The controller 4 also determines the extent of degradation of the lithium-ion battery 2, based on information input from the strain gauge 5. For these related functions, the controller 4 has a charge control unit 41, a capacity change detecting unit 42, and a volume change detecting unit 43.

The charge control unit 41 controls the charging process of the lithium-ion battery 2 by the charging device 3. The charge control unit 41 adjusts the charging time or the voltage value. The charge control unit 41 varies a set value indicative of an upper limit of a charge tolerance, in accordance with the extent of degradation of the lithium-ion battery 2, and outputs the varied value to the charging device 3. For example, the upper limit of the charge tolerance is decreased as degradation increases, and overcharging is thereby prevented, so that the battery operates more stably.

The capacity change detecting unit 42 detects a capacity change of the lithium-ion battery 2 when the lithium-ion battery is fully charged. For example, the capacity change detecting unit 42 maintains, as a table, information on times (charging times) required to reach full charge under various conditions (temperatures, the remaining charge capacities, and the like) that are set during shipping. The capacity change detecting unit 42 can determine degradation of the battery by comparison with a given charging time required to be charged under the same condition.

The volume change detecting unit 43 detects a volume change of the lithium-ion battery 2, based on one or more measured values at the strain gauge 5. For example, when the measured value at the strain gauge is greater than a reference value, it can be determined that the battery volume is expanded.

The controller 4 may be implemented by any hardware, software, or a combination thereof. The controller 4 may be mainly comprised of a microcomputer including, for example, a central processing unit (CPU), a random access memory (RAM), a read only memory (ROM), an auxiliary storage device, an input-output interface (I/O), and the like. The various functions described above are implemented by executing various programs, which are stored in the ROM, the auxiliary storage device, or the like, on the CPU.

The strain gauge 5 is installed on the surface of the lithium-ion battery 2 and outputs an electrical signal in accordance with strain of an installation portion. The strain gauge 5 is installed at a location of an approximately middle portion of the principal surface 24 of the cuboidal lithium-ion battery 2, as illustrated in the example in FIG. 1. Strain detected by the strain gauge 5 corresponds to a slight mechanical change that is made in accordance with a force (load) applied to the installation portion. When the volume of the lithium-ion battery 2 expands, a load is applied to the housing 21 of the lithium-ion battery 2, from the inside to the outside of the housing, and thus pressure of the surface of the housing 21 is increased. When the surface pressure of the lithium-ion battery 2 increases, the strain detected by the strain gauge 5 also increases accordingly. In light of the point describe above, in the present embodiment, the volume change of the lithium-ion battery 2 is detected based on the strain detected by the strain gauge 5.

Note that it is sufficient that the strain gauge 5 can detect expansion of the battery surface caused by degradation of the lithium-ion battery 2, and a given installation location may be a location other than the principal surface 24. For example, the strain gauge may be installed on a given side surface perpendicular to the principal surface 24 of the lithium-ion battery 2. As the strain gauge 5, any type of strain gauge such as a metal strain gauge or a semiconductor strain gauge may be adopted.

Figure 2:
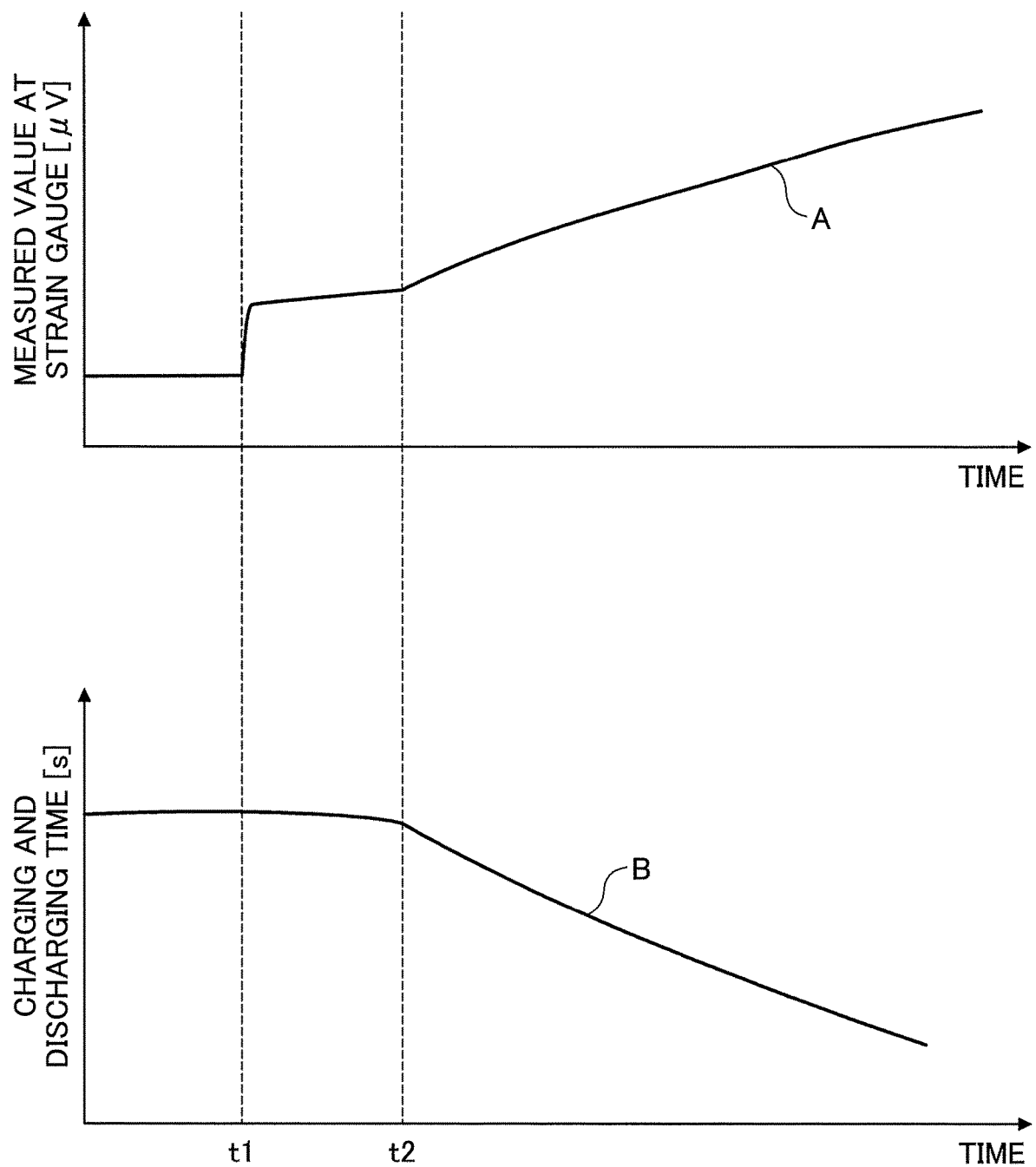
FIG. 2 is a diagram illustrating the relationship between a measured value at a strain gauge, and a charging and discharging time in a charge and discharge test.

Referring now to FIG. 2, a timing at which degradation of the battery is particularly detected in the degradation-determination system 1 according to the present embodiment will be described. FIG. 2 is a diagram illustrating the relationship between the measured value at the strain gauge in a charge and discharge test, in which charging and discharging are repeated, and a given charging and discharging time required for full charging and full discharging. In the charge and discharge test, charging and discharging were repeated until a predetermined capacity tolerance for charging and discharging was reached. While repeated, measured values at the strain gauge, as well as charging and discharging times, were recorded. The graph A in the figure shows characteristics of the measured values at the strain gauge with time in the charge and discharge test. The graph B in the figure shows the characteristics of the charging and discharging time with time in the charge and discharge test. The horizontal axis in each figure represents the elapsed time in the charge and discharge test. The vertical axes in the figures respectively represent the measured value ($\mu$V) at the strain gauge and the charging and discharging time (s).

First, turning to the charging and discharging time on the graph B, the charging and discharging time is almost maintained constantly until the time point t2, and decreases after the time point t2. When the charging and discharging time decreases, the lithium-ion battery 2 is held in a state in which a storable capacity tolerance is gradually decreased, which means that degradation of the battery is increased. In other words, when the charging and discharging time is observed, degradation of the battery can be detected first after the time point t2 elapses from a start of the test.

Next, turning to the measured value at the strain gauge on the graph A, the measured value is increased stepwise at the time point t1 earlier than the time point t2. Then, in a block from the time point t1 to t2, the measured value is increased relatively slowly with respect to a trend after the time point t2. Subsequently, after the time point t2, the measured value is increased relatively greatly with respect to a trend between the time points t1 and t2. When the measured value at the strain gauge increases, the surface of the lithium-ion battery 2 expands and the battery volume is in a state of expanding, which means that degradation of the battery is increased. In other words, when the measured value at the strain gauge 5 is observed, degradation of the battery can be detected at the time point t1 earlier than the time point detected when the charging and discharging time is observed.

Moreover, turning to characteristics of both of the charging and discharging time and the measured value at the strain gauge, there is no sign of degradation of either before the time point t1. Then, in the block between the time points t1 and t2, the charging and discharging time is approximately constant, while the measured value at the strain gauge tends to increase gradually, so that a first sign of degradation can be observed. Additionally, a second sign of degradation can be observed in the block after the time point t2, because the charging and discharging time decreases while the measured value at the strain gauge tends to increase more greatly than that in the block between the time points t1 and t2. In other words, before the time point t2, there is little correlation between characteristics of the measured value at the strain gauge, and characteristics of the charging and discharging time. However, there is a correlation after the time point t2.

With conventional approaches to determine degradation of the lithium-ion battery 2, a state of degradation of the lithium-ion battery 2 is estimated by measuring and monitoring the voltage, current, temperature, or the like associated with the positive terminal 22 and the negative terminal 23. In other words, it is based on the electrical behavior of the battery. This is based on a concept in which electrical behavior is more likely to be emergent earlier than physical behavior such as volume expansion. The electrical behavior is correlated with the charging and discharging time illustrated in FIG. 2.

However, from the results in the charge and discharge test of the lithium-ion battery 2 illustrated in FIG. 2, it has been found that for the lithium-ion battery 2, physical behavior such as a volume change is emergent earlier than electrical behavior, including variations in the charging and discharging time. In the degradation-determination system 1 according to the present embodiment, such a point is focused as a point to determine degradation of a given battery. In other words, the degradation-determination system 1 detects a volume change based on one or more measured values at the strain gauge, detects a capacity change based on the charging and discharging time, and determines degradation of the battery in consideration of two characteristics associated with the volume change and the capacity change. Thus, degradation of the battery can be detected even during a block between the time points t1 and t2, during which detection cannot be performed based on only information on the charging and discharging time.

Note that the time points t1 and t2 illustrated in FIG. 2 appropriately vary depending on the conditions under which a given charge and discharge test, such as an outside temperature, a battery capacity, or a battery type is conducted.

Figure 3:
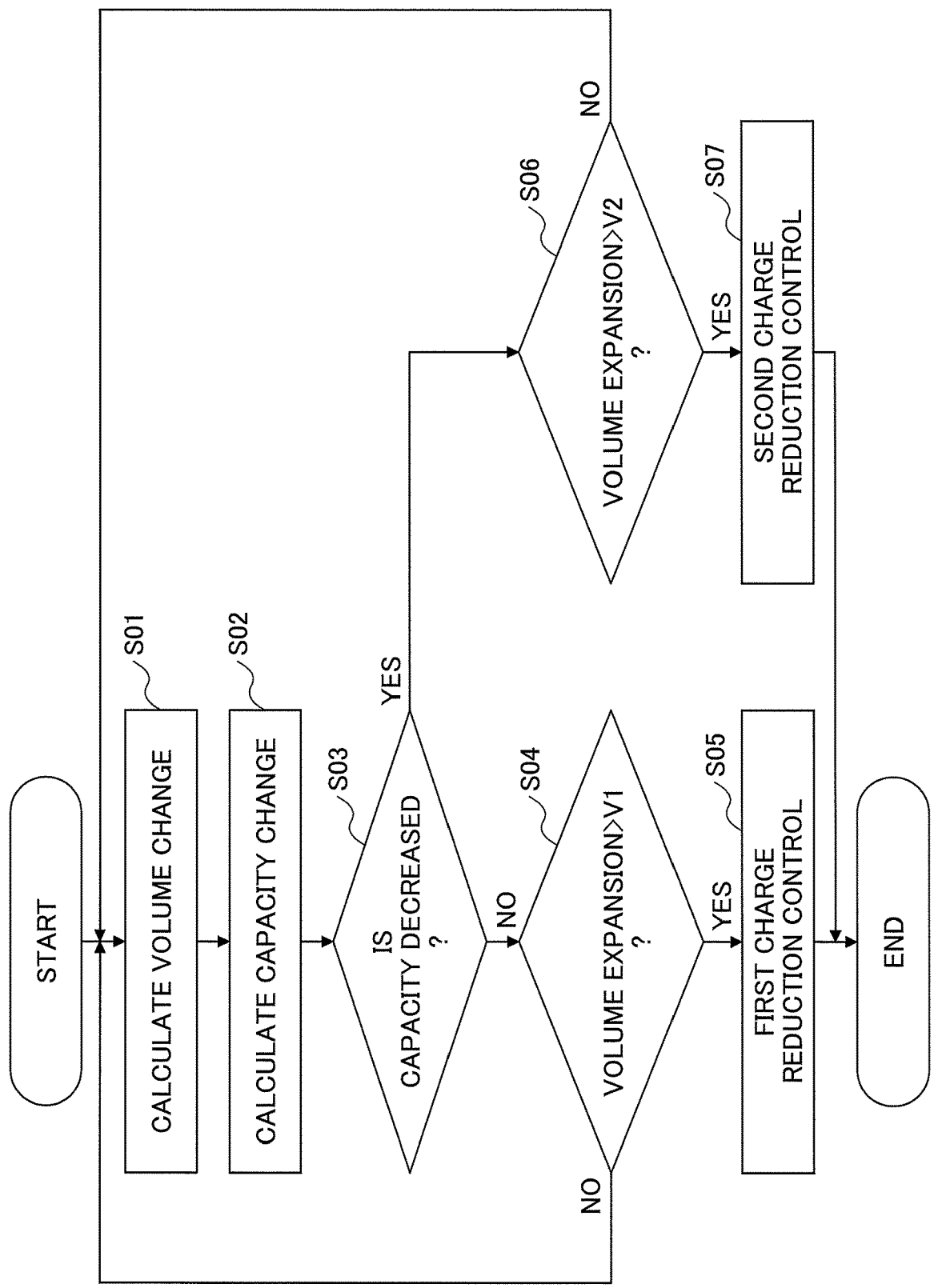
FIG. 3 is a flowchart illustrating the procedure for a degradation-determination process of a lithium-ion battery.

Referring to FIG. 3, a method of determining the degradation of the lithium-ion battery 2 according to the embodiment will be described. FIG. 3 is a flowchart illustrating a procedure for a degradation-determination process of the lithium-ion battery 2 performed by the degradation-determination system 1 according to the embodiment. The process related with the flowchart in FIG. 3 is performed by the controller 4.

In step S01, a volume change (the amount of expansion) of the lithium-ion battery 2 is calculated by the volume change detecting unit 43, based on measured values at the strain gauge 5. For example, the volume change detecting unit 43 stores data indicative of a measured value at the strain gauge 5 in an initial state, and can calculate a magnitude of the expansion amount, based on a magnitude of a difference between a current measured value and the measured value in the initial state.

In step S02, a capacity change of the lithium-ion battery 2 is calculated by the capacity change detecting unit 42. For example, the capacity change detecting unit 42 acquires, from the charging device 3, information indicating a charging time required for the current lithium-ion battery 2 to be fully charged, and information on a measurement condition such as temperature or the remaining charge capacity. Then, the capacity change detecting unit 42 performs comparison with a given charging time that is stored in a table and that is under the same condition during shipping, and calculates the capacity change accordingly. For example, the capacity change can be calculated such that the capacity decreases as a difference between the current charging time and the charging time in the initial state increases.

In step S03 (capacity-change detection step), the capacity change detecting unit 42 determines whether the capacity of the lithium-ion battery 2 is decreased based on an amount of the capacity change of the lithium-ion battery 2 calculated in step S02. For example, if the amount of the capacity change is decreased to be greater than or equal to a predetermined value, the capacity change detecting unit 42 can detect a decrease in the capacity. For a result of the determination in step S03, if the capacity is decreased (Yes in step S03), the process proceeds to step S06. If the capacity is not decreased (No in step S03), the process proceeds to step S04.

Note that in step S03, a state in which it is determined that the capacity is not decreased and the capacity does not change, can cover not only a state in which the amount of the capacity change of the lithium-ion battery 2 calculated in step S02 is 0 and in which a current capacity value and a capacity value in the initial state are identical, but also a state in which the amount of the capacity change is within a predetermined range.

In step S04 (volume-change detection step), the volume change detecting unit 43 determines whether or not an amount of the volume expansion of the lithium-ion battery 2 calculated in step S01 is greater than or equal to a threshold V1. Note that the threshold V1 is preferably less than a rising amount for the measured value at the strain gauge at the time point t1, as illustrated in FIG. 2. With such a manner, volume expansion can be detected during the block between the time points t1 and t2. For a result of the determination in step S04, if the volume expansion is greater than or equal to V1 (Yes in step S04), the process proceeds to step S05. If the volume expansion is less than or equal to V1 (No in step S04), the process returns to step S01.

Note that in the expansion detection in step S04, the configuration that monitors the amount of the volume change, as well as a configuration that monitors an increase rate (slope of the graph A in FIG. 2), may be included. With such a manner, for example, at the time point t1 on the graph A, a stepwise change can be detected rapidly and thus volume expansion can be easily detected. A given measured value at the strain gauge 5 may be used for the determination, without performing conversion to the volume in step S01.

In step S05 (degradation-determination step), the charge control unit 41 can determine that at a timing of either of the time point t1 or t2, first degradation of the lithium-ion battery 2 occurs, because it is determined in step S03 that the capacity is in a state of not being decreased and it is determined in step S04 that the volume expansion is in a state of being greater than or equal to a predetermined amount V1. In such a case, a first charge reduction control is performed to prevent effects due to a first state of degradation.

In the first charge reduction control, the upper limit of the charge tolerance is decreased at one time or multiple times, in accordance with the extent of degradation of the lithium-ion battery 2. Note that in the first charge reduction control, for example, a value (SOH: States of Health) corresponding to the extent of degradation of the battery can be estimated based on variations (amount of volume expansion) in the measured value at the strain gauge, and then a decrease amount of the upper limit of the charge tolerance can be adjusted based on the estimated SOH. Note that in addition to the decrease in the upper limit of the charge tolerance, a parameter to be adjusted in the reduction control may relate to reduction in a given charging time, a decrease in a charge voltage, or an increase in a discharge lower limit. When the process in step S05 is completed, the control flow ends.

In step S06 (volume-change detection step), the volume change detecting unit 43 determines whether or not an amount of the volume expansion of the lithium-ion battery 2 calculated in step S01 is greater than or equal to a threshold V2. Note that the threshold V2 is preferably any value among measured values at the strain gauge after the time point t2 illustrated in FIG. 2. With such a manner, volume expansion can be detected after the time point t2. For a result of the determination in step S06, if the volume expansion is greater than or equal to V2 (Yes in step S06), the process proceeds to step S07. In contrast, if the volume expansion is less than or equal to V2 (No in step S06), the process returns to step S01 at any timing after the time point t2 illustrated in FIG. 2, where second charge reduction control is not yet performed.

In step S07, the charge control unit 41 can determine that at any timing after the time point t2, second degradation of the lithium-ion battery 2 occurs, because it is determined in step S03 that the capacity is in a state of being decreased and it is determined in step S06 that the volume expansion is in a state of being greater than or equal to a predetermined amount V2. In such a case, the second charge reduction control is performed to prevent effects due to a second state of degradation.

In the second charge reduction control, the upper limit of the charge tolerance is decreased at one time or multiple times, in accordance with the extent of degradation of the lithium-ion battery 2. Note that in the second charge reduction control, for example, a given SOH is estimated based on variations (amount of volume expansion) in the measured value at the strain gauge, a change amount of the battery capacity, or both thereof, and then a decrease amount of the upper limit of the charge tolerance can be adjusted based on the estimated SOH. In the second charge reduction control, the decrease amount of the upper limit of the charge tolerance may differ from that in the first charge reduction control. Also, the second charge reduction control may be performed as in the first charge reduction control. When the process in step S07 is completed, the control flow ends.

Referring to FIG. 4, the effect of the degradation-determination system 1 according to the embodiment will be described. FIG. 4 is a diagram illustrating an example of adjusting the upper limit of the charge tolerance over usage time of the lithium-ion battery 2. The graph C in FIG. 4 shows a trend of the upper limit of the charge tolerance in the degradation-determination system 1 according to the embodiment. As a comparative example, the graph D in FIG. 4 shows a trend of a given upper limit of the charge tolerance in a conventional case where only the electrical behavior is monitored. The horizontal axis represents the usage time, and the vertical axis represents the capacity of the lithium-ion battery 2. For the vertical axis, a storable capacity (initial capacity) of the lithium-ion battery 2 in an initial state (e.g., when manufactured) indicates 100%.

In the comparative example, as described with reference to FIG. 2, degradation of the lithium-ion battery 2 cannot be detected since electrical behavior does not change before the time point t2. For this reason, as shown in the graph D in FIG. 4, an initial value (initial factor of safety) of the upper limit of the charge tolerance is set to be decreased, and a reduction range M2 (margin) from 100% indicated as the initial capacity of the lithium-ion battery 2 is set to be increased in order to be able to prevent overcharge with a fixed value indicative of the initial factor of safety, up to a block to the time point t2. Here, the "margin" can also be referred to as a difference between a capacity of the lithium-ion battery 2 capable of being charged in actuality, and an upper limit of a charge capacity tolerance (upper limit of a charge tolerance) set in consideration of safety such as preventing of overcharging.

In contrast, in the degradation-determination system 1 according to the present embodiment, in a state in which volume expansion of the lithium-ion battery 2 is detected by the volume change detecting unit 43 and a state in which the decrease in capacity of the lithium-ion battery 2 is not detected by the capacity change detecting unit 42, it is determined that the lithium-ion battery 2 is held in a state of degradation. That is, degradation is determined based on physical behavior in addition to electrical behavior of the lithium-ion battery 2. With such a configuration, degradation of the lithium-ion battery 2 can be detected even during a block between time points t1 and t2 that is a timing earlier than the time point t2, as shown in the graph C in FIG. 4. In other words, degradation of the battery can be detected even during a block being an earlier timing, where during the block, detection cannot be performed in the conventional determination as to whether degradation occurs based on the electrical behavior. With such a manner, as represented by the arrow Y in FIG. 4, a timing at which degradation is detected can be advanced, and resolution used when degradation is determined can be increased. Thus, accuracy for determining degradation is improved. Accordingly, the degradation-determination system 1 can estimate the state of degradation of the battery more accurately.

Further, in the degradation-determination system 1 according to the present embodiment, when it is determined that the lithium-ion battery 2 is in a state of degradation, the controller 4 performs the charge reduction control for reducing the charge of the lithium-ion battery 2. Specifically, the upper limit of the charge tolerance is decreased in accordance with the extent of degradation, and thereby the capacity of the battery set when fully charged is kept low.

As described above, in the degradation-determination system 1 according to the present embodiment, the accuracy in determining degradation of the lithium-ion battery 2 can be improved. Thus, the timing at which degradation is first detected can be advanced compared to the conventional case. When an earlier timing at which degradation is detected can be set, charge reduction control is also performed earlier than the conventional case and the process of decreasing the upper limit of the charge tolerance can be performed accordingly. In such a case, because an initial value (initial factor of safety) of the upper limit of the charge tolerance does not need to be considered after the time point t1, a given margin set in a usage range of the battery can be decreased compared to the conventional case, and a higher initial value of the upper limit of the charge tolerance is set in comparison to the conventional case. Therefore, a reduction range M1 (margin) from 100% indicated as the initial capacity of the lithium-ion battery 2 can be decreased. That is, by determining degradation with high precision, control for decreasing the upper limit of the charge tolerance can be performed more accurately than a conventional control system. With this configuration, as represented by the arrow X in FIG. 4, for the graph C according to the present embodiment, a given initial margin M1 can be decreased by X relative to a conventional margin M2, and a subsequent margin can be also set to be smaller than the conventional margin over the whole time course, compared to the conventional case. In other words, in comparison to the conventional case, the battery can be used in proximity to a limit of a given usage range of the battery. As a result, the degradation-determination system 1 according to the present embodiment can perform charging at a capacity close to an original capacity (100%) of the lithium-ion battery 2 in comparison to the conventional case, thereby enabling charge efficiency to be improved.

In the degradation-determination system 1 according to the present embodiment, when volume expansion of the lithium-ion battery 2 is first detected by the volume change detecting unit 43, e.g., at the time point t1 illustrated in each of FIGS. 2 and 4, the charge control unit 41 determines that the lithium-ion battery 2 is in a state of degradation. With such a manner, degradation of the lithium-ion battery 2 can be detected immediately when physical behavior related with degradation of the lithium-ion battery 2 illustrated in FIG. 2 occurs first. Accordingly, accuracy for determining degradation can be further improved.

Additionally, in the degradation-determination system 1 according to the present embodiment, the volume change detecting unit 43 detects a volume change of the lithium-ion battery 2 based on variations in surface pressure of the lithium-ion battery 2. When the battery 2 becomes degraded and expands, a load is applied from the inside to the outside of the battery 2 and surface pressure is increased accordingly. Thus, it has been found that variations in the surface pressure of the lithium-ion battery 2 are strongly correlated with the volume change. Therefore, by monitoring the variations in the surface pressure, volume change of the lithium-ion battery 2 can be accurately detected.

Moreover, in the degradation-determination system 1 according to the present embodiment, variations in pressure of the battery surface are detected based on variations in the measured value at the strain gauge 5 that is installed on the surface of the lithium-ion battery 2. With such a manner, a relatively inexpensive strain gauge 5 is used, resulting in a low-cost way.

Furthermore, in the degradation-determination system 1 according to the present embodiment, the capacity change detecting unit 42 detects the capacity change of the lithium-ion battery 2, based on comparison between charging characteristics (for example, charging times) of the lithium-ion battery 2 under the same condition. Because variations in the charging characteristic are strongly correlated with the capacity change, the capacity change of the lithium-ion battery 2 can be detected accurately by monitoring the variations in the charging characteristic.

The present embodiment has been described above with reference to the specific examples. However, the present disclosure is not limited to these specific examples. Modifications to the specific examples to which those skilled in the art would make design changes as appropriate are also included within a scope of the present disclosure as long as they have features of the present disclosure. Elements provided in the specific examples described above, and the arrangement, conditions, shape, and the like thereof are not limited to the examples and can be modified as appropriate. For the elements provided in the above-described specific examples, a combination thereof can be modified as appropriate, unless there is technical inconsistency.

In the above embodiments, the configuration in which the volume change detecting unit 43 detects the volume expansion of the battery based on measured values at the strain gauge 5 installed on the battery surface, is illustrated. However, when variations in battery surface pressure can be measured, a pressure sensor other than the strain gauge may be used. Additionally, information measured at a location other than the battery surface may be used. For example, when the lithium-ion battery 2 becomes degraded, a gas tends to be generated in an interior of the battery. Thus, a gas sensor may be provided in an interior of a given battery and an approach to detect gas generation may be adopted.

In the above embodiments, an approach in which the capacity change detecting unit 42 detects the capacity change of the lithium-ion battery 2 based on comparison between a charging time that is set during shipping and that is under the same condition such as a temperature or the remaining charge capacity, and a current charging time, is illustrated. However, such an approach to detect the capacity change is not limited to the approach described above. For example, every time charging and discharging are performed, information indicating a charging and discharging time set under a corresponding operation condition is updated from information set during shipping, and variations in the charging and discharging time may be detected while the updated information is a reference. A configuration in which a capacity change is detected using a charging characteristic (storable capacity, or the like) other than variations in a given charging and discharging time, may be also used.

In the above embodiments, the lithium-ion battery 2 is used as an example of a target for which degradation is determined. However, another secondary battery such as a nickel hydride battery or a lead battery can be adopted.

In the above embodiments, the configuration in which charge reduction control is performed when degradation is determined, is illustrated. However, another control or process may be performed after degradation is determined.

This International Application claims priority to Japanese Patent Application No. 2018-147713, filed Aug. 6, 2018, the contents of which are incorporated herein by reference in their entirety.

REFERENCE SIGNS LIST 1 degradation-determination system, 2 lithium-ion battery (secondary battery), 3 charging device, 4 controller, 5 strain gauge, 21 housing, 22 positive terminal, 23 negative terminal, 24 principal surface, 41 charge control unit, 42 capacity change detecting unit, 43 volume change detecting unit, step S03 capacity-change detection step, step S04, S06, volume-change detection step, step S05 degradation-determination step

The invention claimed is:

1. A degradation-determination system for a secondary battery comprising:
   a volume change detecting unit configured to detect a volume change of the secondary battery;
   a capacity change detecting unit configured to detect a capacity change of the secondary battery; and
   a charge control unit configured to control charge of the secondary battery,
   wherein the charge control unit is configured to determine that the secondary battery is in a state of degradation, upon occurrence of a condition in which volume expansion of the secondary battery is detected by the volume change detecting unit, in conjunction with a condition in which a decrease in a capacity of the secondary battery is not detected by the capacity change detecting unit, and
   wherein the charge control unit is configured to not estimate the state of degradation of the secondary battery based on a voltage across electrode terminals of the secondary battery and a current flowing through the electrode terminals.

2. The degradation-determination system for a secondary battery according to claim 1, wherein the charge control unit is configured to reduce the charge of the secondary battery upon determining that the secondary battery is in the state of degradation.

3. The degradation-determination system for a secondary battery according to claim 1, wherein the charge control unit is configured to determine that the secondary battery is in the state of degradation upon detecting the volume expansion of the secondary battery by the volume change detecting unit.

4. The degradation-determination system for a secondary battery according to claim 1, wherein the volume change detecting unit is configured to detect the volume change of the secondary battery based on a variation in surface pressure of the secondary battery.

5. The degradation-determination system for a secondary battery according to claim 4, further comprising a strain gauge installed on a surface of the secondary battery,
wherein the volume change detecting unit is configured to detect the variation in the surface pressure of the secondary battery based on a variation in a measured value at the strain gauge.

6. The degradation-determination system for a secondary battery according to claim 1, wherein the capacity change detecting unit is configured to detect the capacity change of the secondary battery based on comparison between charging characteristics of the secondary battery under a same condition.

7. The degradation-determination system for a secondary battery according to claim 1, wherein the secondary battery is a lithium-ion battery.

8. A method for determining degradation of a secondary battery, the method comprising:
 detecting a volume change of the secondary battery;
 detecting a capacity change of the secondary battery; and
 determining that the secondary battery is in a state of degradation, upon occurrence of a condition in which volume expansion of the secondary battery is detected in the detecting of the volume change, in conjunction with a condition in which a decrease in a capacity of the secondary battery is not detected in the detecting of the capacity change,
wherein in the determining that the secondary battery is in a state of degradation, the state of degradation of the secondary battery is not estimated based on a voltage across electrode terminals of the secondary battery and a current flowing through the electrode terminals.

* * * * *